United States Patent
Braithwaite

(10) Patent No.: US 7,095,799 B2
(45) Date of Patent: Aug. 22, 2006

(54) SYSTEMS AND METHODS FOR PROVIDING BASEBAND-DERIVED PREDISTORTION TO INCREASE EFFICIENCY OF TRANSMITTERS

(75) Inventor: Richard Neil Braithwaite, Orange, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 855 days.

(21) Appl. No.: 10/135,918

(22) Filed: Apr. 29, 2002

(65) Prior Publication Data

US 2003/0202614 A1 Oct. 30, 2003

(51) Int. Cl.
*H03K 1/02* (2006.01)
*H03D 3/00* (2006.01)
*H03C 1/02* (2006.01)

(52) U.S. Cl. .................. 375/296; 329/318; 332/159
(58) Field of Classification Search ................ 375/296, 375/295, 284, 285; 329/318; 455/504, 330; 332/159
See application file for complete search history.

(56) References Cited

U.S. PATENT DOCUMENTS

| | | | |
|---|---|---|---|
| 6,316,983 B1 * | 11/2001 | Kitamura | 327/317 |
| 6,373,902 B1 | 4/2002 | Park et al. | |
| 6,724,832 B1 * | 4/2004 | Hershberger | 375/301 |
| 6,785,342 B1 * | 8/2004 | Isaksen et al. | 375/284 |
| 2003/0076894 A1 * | 4/2003 | Jin et al. | 375/296 |
| 2003/0179831 A1 * | 9/2003 | Gupta et al. | 375/296 |
| 2004/0013206 A1 * | 1/2004 | Gamm et al. | 375/296 |
| 2004/0075497 A1 * | 4/2004 | Miyaji et al. | 330/151 |

FOREIGN PATENT DOCUMENTS

EP 1 199 814 A1 4/2002

OTHER PUBLICATIONS

Katz, A., "Linearization: Reducing Distortion in Power Amplifiers", IEEE Microwave Magazine, vol. 2, No. 4 Dec. 2001, pp. 37-49.

* cited by examiner

*Primary Examiner*—Khai Tran

(57) ABSTRACT

Systems and methods for providing baseband predistortion within a transmitter. In a simplified embodiment, the transmitter contains a main signal path that receives an input signal and generates a main signal in response thereto. A filter in the main signal path is used for removing unwanted signal components from the main signal. A power amplifier having non-linearity is also located within the transmitter. A digital predistortion module is used by the transmitter to digitally process the input signal to generate a predistortion signal that models an inverse of the non-linearity of the power amplifier. In addition, means, located between the filter and the power amplifier, for combining the predistortion signal with the main signal to generate a combined signal, and for providing the combined signal to the power amplifier, is located within the transmitter.

18 Claims, 10 Drawing Sheets

SYSTEMS AND METHODS FOR PROVIDING BASEBAND-DERIVED PREDISTORTION TO INCREASE EFFICIENCY OF TRANSMITTERS

FIELD OF THE INVENTION

The invention generally relates to telecommunications and, more particularly, to systems and methods for increasing the efficiency of transmitters through use of baseband-derived predistortion.

BACKGROUND OF THE INVENTION

Linearity of transmitters that convert baseband signals into radio frequency (RF) signals for transmission is important in band-limited communication systems. Nonlinear behavior in the transmitters causes the transmitted power of signals having amplitude modulation components to leak outside a frequency band allocated to the signals. The leakage of power outside of the allocated frequency band, and especially into adjacent channels, is referred to as adjacent channel power leakage (ACPL). ACPL is usually defined as a ratio of average power in an adjacent channel to an average power in the allocated channel. As is known in the art, ACPL is of great importance within the telecommunications field and, in the United States, is strictly regulated by the Federal Communications Commission (FCC).

Linearity is of great importance to cellular networks that are based on digital modulation formats and in which the cellular network signals are amplitude modulated. One such digital modulation format is code division multiple access (CDMA). CDMA is one of several digital wireless transmission methods in which signals are encoded using a specific pseudo-random sequence, or code, to define a communication channel. A CDMA-capable receiver can use the code to decode a received signal in the presence of other signals in the channel. In fact, CDMA is a "spread spectrum" technique that allows multiple users to share the same radio frequency spectrum by assigning each active user a unique code. Unfortunately, the combination of AM and transmitter non-linearity causes the transmitter to generate frequency components that corrupt adjacent channels. Therefore, ACPL should be considered and appropriately addressed in the design of the transmitter.

SUMMARY OF THE INVENTION

The invention provides a transmitter incorporating baseband-derived predistortion and a method for applying baseband-derived predistortion to a power amplifier. Baseband-derived predistortion derives a predistortion signal from the input signal, i.e., a baseband signal. Predistortion increases the efficiency of the transmitter for a given level of ACPL. Predistortion using a baseband-derived predistortion signal provides greater increases in transmitter efficiency than conventional predistortion techniques.

Briefly described, in architecture, one embodiment of the system, among others, can be implemented as follows. A transmitter for incorporating baseband-derived predistortion contains a main signal path that receives an input signal and generates a main signal in response thereto. A filter in the main signal path is used for removing unwanted signal components from the main signal. A power amplifier having non-linearity is also located within the transmitter. A digital predistortion module is used by the transmitter to digitally process the input signal to generate a predistortion signal that models an inverse of the non-linearity of the power amplifier. In addition, means, located between the filter and the power amplifier, for combining the predistortion signal with the main signal to generate a combined signal, and for providing the combined signal to the power amplifier, is located within the transmitter.

The invention can also be viewed as providing methods for providing baseband predistortion to increase the efficiency of transmitting devices. In this regard, one embodiment of such a method, among others, can be broadly summarized by the following steps: digitally deriving from an input signal, a predistortion signal that models an inverse of non-linearity of a power amplifier; generating a main signal from the input signal; filtering to remove unwanted signal components from the main signal; and combining the predistortion signal with the main signal after the filtering step to generate a combined signal for driving the power amplifier.

Other systems, methods, and advantages of the invention will be or will become apparent to one with skill in the art upon examination of the following drawings and detailed description. It is intended that all such additional systems, methods, features, and advantages be included within this description, be within the scope of the invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the invention. Moreover, in the drawings, like reference numerals designate corresponding parts throughout the several views.

DETAILED DESCRIPTION

To illustrate and describe the system, a transmitter of a cellular telephone is described for illustration purposes. It should be noted, however, that the invention may be applicable to any transmitter. In addition, the transmitter may be part of any mobile communication device.

Figure 1:
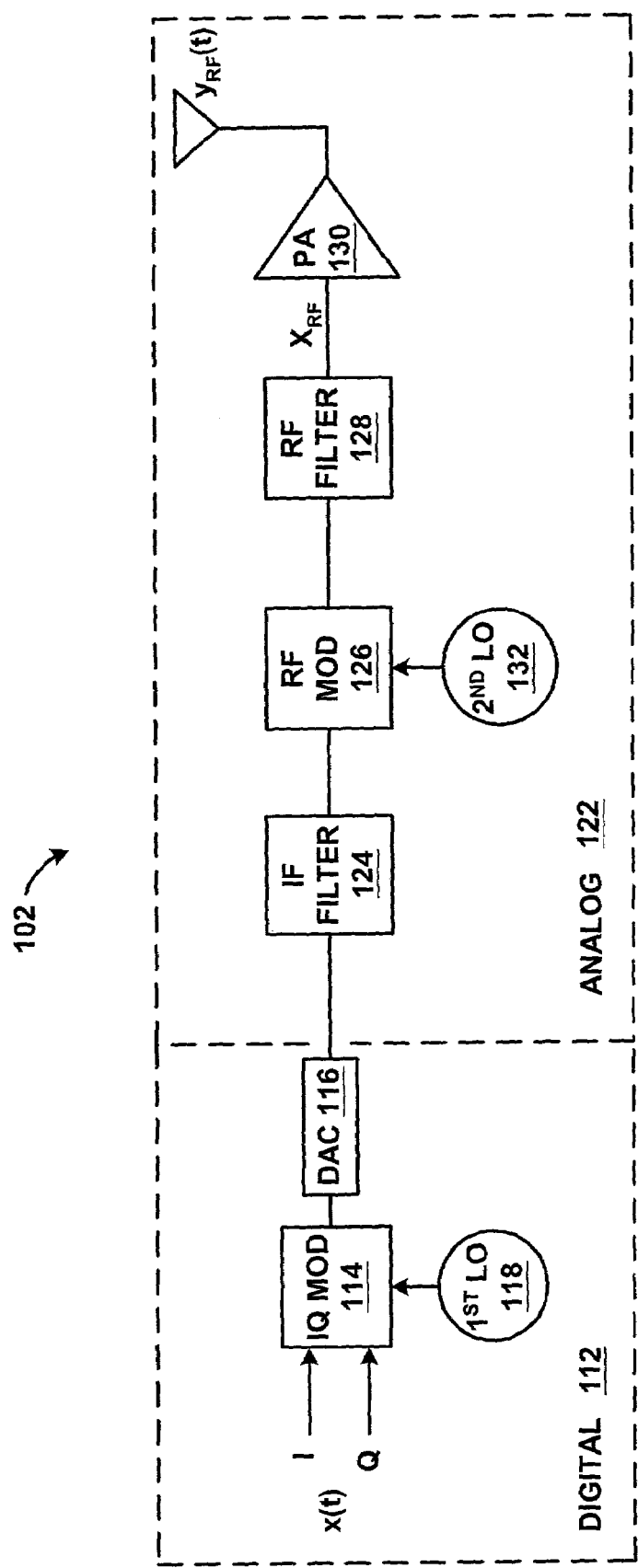
FIG. 1 is a block diagram illustrating a prior art transmitter of a cellular telephone that utilizes digital modulation.

Prior Art Transmitter that Utilizes Digital IF Conversion and an Analog IF Filter Referring now to the drawings, in which like reference numerals designate corresponding parts throughout the drawings, FIG. 1 is a block diagram that illustrates a prior art transmitter 102 of a cellular telephone that utilizes digital modulation with a non-zero AM component, such as, but not limited to, CDMA. It should be noted that, while the disclosure exemplifies a transmitter for transmitting an analog transmission signal utilizing the CDMA transmission method, other transmission methods may be substituted. A digital input signal x(t) received by the transmitter 102 is composed of a quadrature pair of digital signal components, denoted as (I) and (Q). Specifically, (I) represents an in-phase component of the digital input signal x(t) and (Q) represents a quadrature component of the digital input signal x(t). An output of the transmitter 102 is an RF signal that is denoted by $y_{RF}(t)$.

The transmitter 102 is composed of a digital portion 112 and an analog portion 122. The digital portion 112 of the transmitter 102 is composed of an IQ modulator 114, a digital-to-analog converter (DAC) 116, and a first local oscillator 118. The analog portion 122 of the transmitter 102 is composed of an IF filter 124, a radio frequency (RF) modulator 126, an RF filter 128, a power amplifier (PA) 130, and a second local oscillator 132.

The IQ modulator 114 receives the digital input signal x(t), composed of the in-phase component (I) and the quadrature component (Q), from a digital signal source (not shown). The IQ modulator 114 additionally receives a digital IF carrier signal from the first local oscillator 118. The IQ modulator 114 modulates the IF carrier signal with the digital input signal x(t) in a manner that allows both the in-phase component (I) and the quadrature component (Q) of the digital input signal x(t) to be carried in a single channel. The result of the modulation is a digital IF signal that includes sidebands contributed by the digital input signal x(t). The digital IF signal has a substantially higher frequency than that of the digital input signal x(t). The first IQ modulator 114 feeds the digital IF signal to the DAC 116. The DAC 116 converts the digital IF signal from a digital signal to an analog signal, namely, an analog IF signal, for use by the analog portion 122 of the transmitter 102.

The DAC 116 feeds the analog IF signal to the IF filter 234. The IF filter 234 is a band-pass filter that limits the bandwidth of the analog IF signal to the frequency range of the sidebands contributed by the digital input signal x(t). The IF filter 124 may additionally remove quantization noise added to the analog IF signal by the DAC 116 to the extent that such noise is at frequencies outside the pass-band of the IF filter.

The IF filter 124 feeds the filtered analog IF signal to the RF modulator 126. The RF modulator 126 additionally receives an RF carrier signal from the second local oscillator 132. The frequency of the second local oscillator defines the transmission frequency of the transmitter 102. In the transmitter 102, and in the transmitters described herein with reference to FIGS. 3–8, the RF carrier signal is an analog signal. The RF modulator 126 modulates the RF carrier signal received from the second local oscillator 132 with the analog IF signal received from the IF filter 124 to generate an RF signal.

The RF modulator 126 feeds the RF signal to the RF filter 128. The RF filter 128 is a band-pass filter that limits the bandwidth of the modulated RF signal to the frequency range specified for the transmission signal $y_{RF}(t)$ of the transmitter 102.

The RF filter 128 feeds the filtered RF signal as a drive signal to the PA 130. The PA 130 amplifies the filtered RF signal to provide the transmission signal $y_{RF}(t)$. However, the non-linearity of the PA 130 will, unless corrected, add frequency components to the transmission signal $y_{RF}(t)$ that result in a portion of the RF power outputted by the PA 130 being at frequencies outside the channel allocated to the transmitter 102.

Thus, the prior art transmitter 102 of FIG. 1 is subject to adjacent-channel power leakage (ACPL). Leakage of RF power into adjacent channels typically has two principal causes: broadband noise, including the noise originating from digital quantization; and distortion resulting from non-linearities in the transmitter, particularly the non-linearity of the power amplifier. The state of the art for minimizing adjacent-channel power leakage is to (1) use aggressive IF filtering by the IF filter 124 after the DAC 116 to attenuate quantization noise and other unwanted signal components in the filtered IF signal, and (2) make individual devices, in particular the PA 130, as linear as possible. However, the linearity of the PA 130 is increased at the expense of reduced power-added efficiency. Reduced power-added efficiency decreases battery life or requires that a larger battery be provided, both of which are undesirable in a modern cellular telephone.

Predistortion techniques have been used to attempt to reduce the effects of non-linearity of the PA 130. Predistortion has been provided by deriving a non-linear predistortion signal that is combined with the analog signal prior to the IF filter 124. The predistortion signal is intended to compensate for the non-linearity of the PA 130. However, to be effective, the predistortion signal requires a bandwidth greater than the pass-band of the IF filter 124. Combining the predistortion signal with the analog signal prior to the IF filter 124 would result in the IF filter 124 filtering out part of the predistortion signal. This substantially reduces the ability of the predistortion signal to reduce the effects of power amplifier non-linearity.

Figure 2:
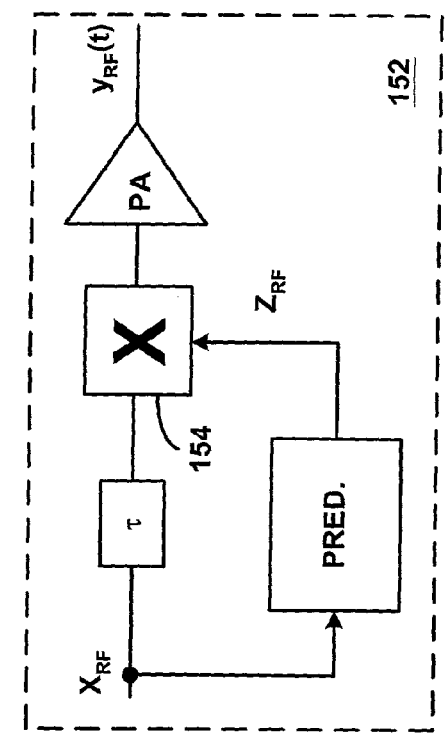
FIG. 2 illustrates two examples of prior art predistortion modules that may be utilized by the prior art transmitter of FIG. 1.
Figure 2:
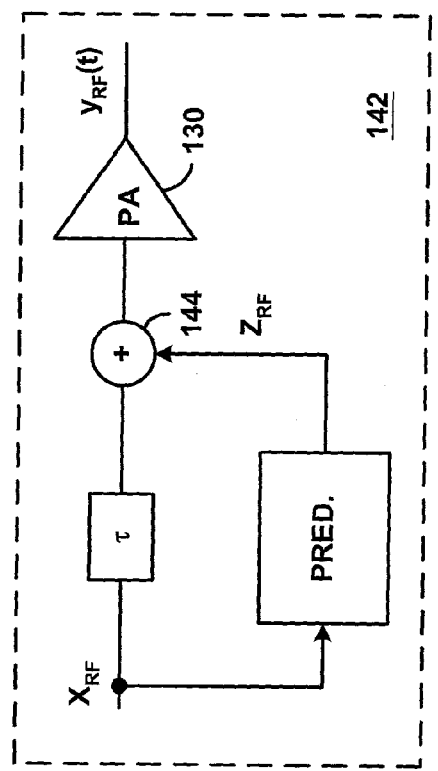

An alternative approach presently used to reduce the effects of non-linearity in the PA 130 using predistortion is to derive a predistortion signal from the filtered RF signal outputted by the RF filter 128 and to combine the predistortion signal with the filtered RF signal just prior to amplification by the PA 130. Two examples of prior art predistortion modules are shown in FIG. 2. The predistortion modules will be described with reference to FIGS. 1 and 2.

The input to the predistortion module is the filtered RF signal ($X_{RF}$) outputted by the RF filter 128. The predistortion modules 142, 152 are analog circuits that process the filtered RF signal to produce a RF predistortion signal $Z_{RF}$ as an output. The RF predistortion signal is typically a nonlinear function of the filtered RF signal $X_{RF}$.

As shown by FIG. 2, the RF predistortion signal $Z_{RF}$ may be combined with the filtered RF signal $X_{RF}$ either additively 142 or multiplicatively 152. For the additive technique 142 of combining the predistortion signal, the RF predistortion signal $Z_{RF}$ is added to the original filtered RF signal by an addition module 144. The resulting predistorted RF signal has a non-linear amplitude response that compensates for the non-linearity of the PA 130.

Alternatively, for the multiplicative technique 152 of applying the predistortion signal, gain is applied to the filtered RF signal and the gain is modulated in response to the RF predistortion signal $Z_{RF}$. Specifically, the RF predistortion signal $Z_{RF}$ is multiplied with the RF signal ($X_{RF}$) by a multiplication module 154 to compensate for non-linearity of the PA 130. Additive and multiplicative predistortion correction require time alignment of the predistortion signal and the filtered RF signal so that both signals reach the addition module 144 or multiplication module 154, respectively, at the same time for proper predistortion compensation to occur.

A predistortion signal generated from the filtered RF signal in the analog portion of 122 of the transmitter 102 is not fully effective in substantially reducing adjacent-channel power leakage. As an example, the ability to generate a predistortion signal that is effective over a large range of transmitter power outputs and temperatures is difficult with analog circuitry. Transmitters in devices such as, but not limited to, mobile telephones are required to operate over a wide range of transmission powers and temperatures. Also, since the transmission power of certain transmitters (e.g., cellular telephone transmitters) is adjusted by the cellular network based upon distance from transmitter towers, the DC operating point of the transmitter is changed in accordance with its transmission power to conserve battery life. The different operating points of the transmitter result in further difficulties in generating an effective predistortion signal. Further, RF predistortion is expensive in terms of component costs relative to the total cost of the components comprising the transmitter 102 (e.g., cellular phone). In addition, RF predistortion consumes excess space in transmitters, such as, but not limited to, the transmitter in a cellular telephone. Excess consumption of space is undesirable in cellular telephones since smaller-sized handsets are desired by consumers.

To address the above-mentioned shortcomings, the transmitters of the invention derive a predistortion signal digitally from a digital baseband signal, namely, the digital input signal x(t), which is a baseband signal. The predistortion signal is derived from the baseband input signal x(t) prior to the baseband input signal x(t), or a digital signal derived from the baseband input signal x(t), being converted to an analog signal by a digital-to-analog converter. Moreover, the predistortion signal is derived from the baseband input signal x(t) before any filtering is applied to the baseband input signal x(t).

As noted above, however, it is not practical to combine the digital predistortion signal with the baseband input signal x(t) itself, or with an analog signal linearly derived from the baseband input signal x(t), to form a combined signal because filtering that would be applied to such a combined signal, such as by the IF filter 124, would remove the out-of-band frequency components contributed to the combined signal by the predistortion signal. Accordingly, the invention combines the predistortion signal with the baseband input signal x(t), or with a signal linearly derived from the baseband input signal x(t), after any filtering is applied to such signals. This ensures that the out-of-band frequency components of the predistortion signal reach the power amplifier where they can reduce the effects of the non-linearity of the power amplifier.

The invention will be described with reference to examples in which the predistortion signal is combined with the baseband input signal x(t) or with a signal linearly derived from the baseband input signal x(t) by addition. However, the invention may be implemented with equal success by combining the predistortion signal with the baseband input signal x(t), or a signal linearly derived from the input signal, by multiplication.

Figure 3:
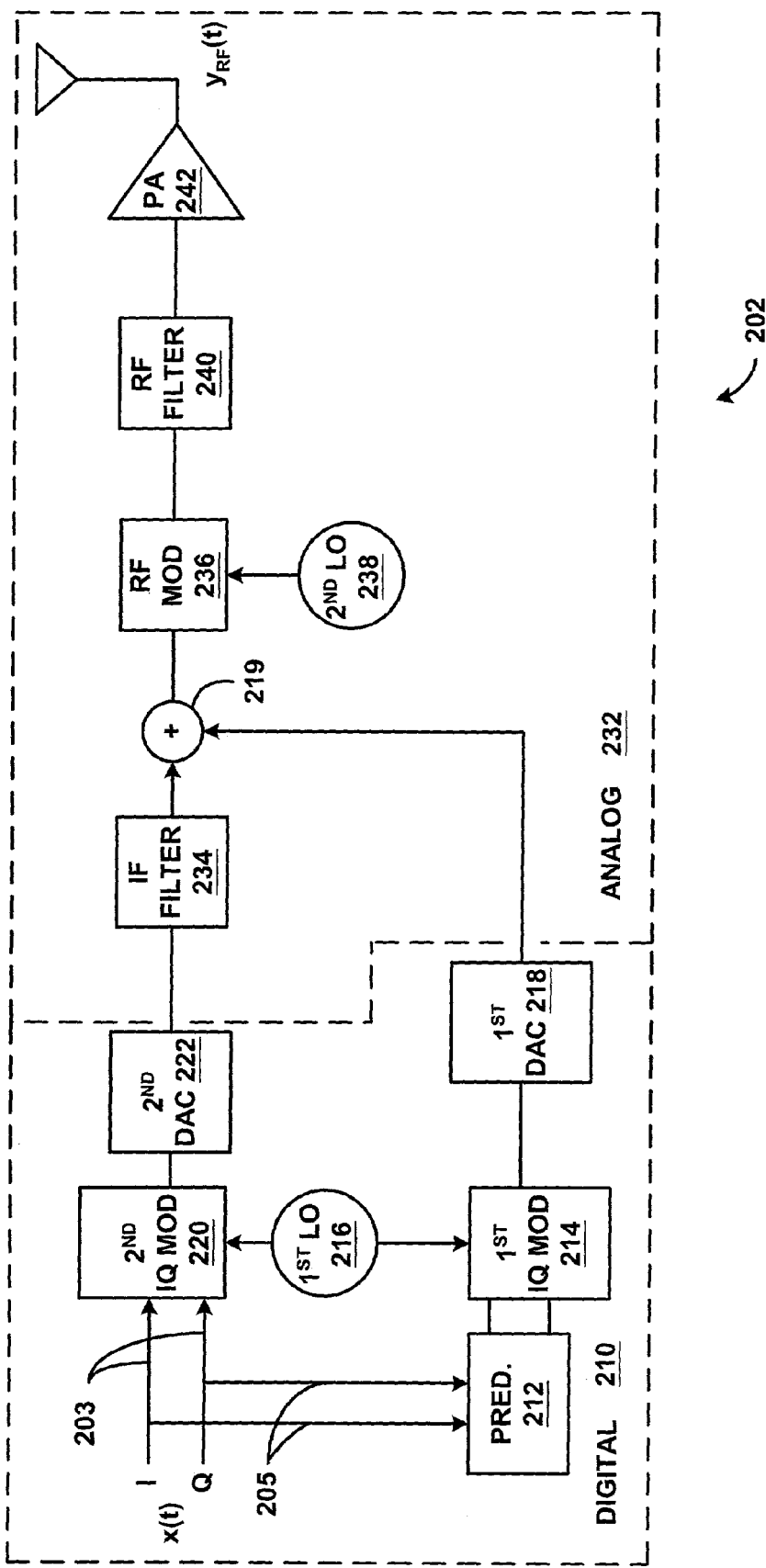
FIG. 3 is a block diagram illustrating a first exemplary embodiment of a transmitter of the invention.

Transmitter According to the Invention Utilizing Digital IF Conversion and Analog IF Filter FIG. 3 is a block diagram showing a first exemplary embodiment 202 of a transmitter according to the invention. The transmitter 202 digitally derives a digital predistortion signal from the digital input signal x(t) and combines an analog predistortion IF signal generated from the digital predistortion signal with an analog main IF signal to generate a combination signal that is fed to a power amplifier. The combination is performed after an IF filter that removes unwanted signals from the main IF signal but limits the bandwidth of the main IF signal. The main IF signal is a signal linearly derived from the digital input signal x(t). It should be noted that while the following describes use of a digital input signal, it should be noted that an analog input signal may be utilized in accordance with an alternative embodiment of the invention.

The digital predistortion signal has a higher sampling frequency than the digital input signal x(t) to enable the digital predistortion signal to represent the out-of-band frequency components of the distortion generated by the power amplifier with an accuracy sufficient for it to provide an effective reduction of the effects of the non-linearity of the power amplifier. Combining the predistortion IF-signal with the main IF signal after the IF filter prevents the IF filter from removing out-of-band frequency components originating in the predistortion signal.

The transmitter 202 is composed of a digital portion 210 and an analog portion 232. The transmitter 202 is additionally composed of a main signal path 203, a predistortion signal path 205, a first local oscillator 216, an addition module 219, an RF modulator 236, a second local oscillator 238, an RF filter 240 and a power amplifier (PA) 242.

The predistortion signal path 205 is composed of a predistortion signal generator 212, a first IQ modulator 214 and a first digital-to-analog converter (DAC) 218. The predistortion signal generator 212 digitally processes the in-phase component (I) and the quadrature component (Q) of the digital input signal x(t) to derive a digital predistortion signal having an in-phase component and a quadrature component. The predistortion signal models an inverse of the non-linearity of the PA 242.

To derive the digital predistortion signal, the predistortion signal generator 212 digitally processes the digital input signal x(t) using a power series such as, but not limited to, a Taylor series. Alternatively, the predistortion signal generator 212 may use another non-linear transform function known in the art. Examples of non-linear transform functions are described by Allen Katz, "Linearization: Reducing Distortion in Power Amplifiers," *IEEE Microwave Magazine*, vol. 2, issue 4, pp. 37–49 (December 2001). The predistortion signal generator 212 outputs the in-phase and quadrature components of the digital predistortion signal separately.

The predistortion signal generator 212 feeds the in-phase component and the quadrature component of the digital predistortion signal to the first IQ modulator 214. The first IQ modulator 214 additionally receives a digital intermediate-frequency (IF) carrier signal from the first local oscillator 216. The first IQ modulator 214 digitally modulates the IF carrier signal with the in-phase and quadrature components of the digital predistortion signal to generate a digital predistortion IF signal. The digital predistortion IF signal includes sidebands contributed by the digital predistortion signal and has a frequency substantially higher than the frequency range of the digital predistortion signal. The first IQ modulator 214 modulates the IF carrier signal in a manner that allows both the in-phase component and the quadrature component of the digital predistortion signal to be carried by a single channel.

The first IQ modulator 214 feeds the digital predistortion IF signal to a first digital-to-analog converter 218. The first digital-to-analog converter 218 converts the digital predistortion IF signal from a digital signal to an analog signal, namely, an analog predistortion IF signal. The digital-to-analog converter 218 feeds the analog predistortion IF signal to one input of the addition module 219, which will be further described below. However, the main signal path 203 will be described next.

The main signal path 203 of the transmitter 202 is composed of a second IQ modulator 220, a second DAC 222 and an IF filter 234.

The second IQ modulator 220 digitally modulates the digital intermediate frequency (IF) carrier signal received from the first local oscillator 216 with the in-phase component I and the quadrature component Q of the digital input signal x(t) to generate a digital main IF signal. The digital main IF signal includes components contributed by the digital input signal x(t) and has a frequency range substantially higher than the frequency range of the digital input signal x(t). The second IQ modulator 220 modulates the IF carrier signal in a manner that allows both the in-phase component and the quadrature component of the digital input signal x(t) to be carried in a single channel, as described above.

The second IQ modulator 220 feeds the digital main IF signal to the second DAC 222. The second DAC 222 converts the digital main IF signal from a digital signal to an analog signal, namely, an analog main IF signal. The second DAC feeds the analog main IF signal to an input of the IF filter 234.

The IF filter 234 is a band-pass filter that removes unwanted signal components from the analog main IF signal. Specifically, the IF filter 234 limits the bandwidth of the analog main IF signal to the frequency range of the sidebands contributed by the digital input signal x(t). The unwanted signal components removed by the IF filter 234 include quantization noise added by the second DAC 222 to the extent that such noise is outside the pass-band of the IF filter 234. The IF filter 234 may additionally remove other out-of-band signal components introduced by the second DAC 222 or otherwise present in the analog main IF signal.

The predistortion IF signal does not pass through the IF filter 234, so that the IF filter 234 does not remove the out-of-band frequency components that cancel the signal components generated by the non-linearity of the PA 242. Instead, the addition module 219 combines the analog predistortion IF signal received from the predistortion signal path 205 with the analog main IF signal received from the main signal path 203 to generate a combined IF signal. The combined IF signal includes sidebands contributed by the predistortion signal and is capable of canceling the signal components generated by the non-linearity of the PA 242.

The combined IF signal is fed from the addition module 219 to the RF modulator 236. The RF modulator 236 additionally receives an analog RF carrier signal from the second local oscillator 238. The frequency of the RF carrier signal generated by the second local oscillator 238 defines the transmission frequency of the transmitter 202. The RF modulator 236 modulates the RF carrier with the combined IF signal received from the addition module 219 to generate an RF signal.

The RF modulator 236 feeds the RF signal to the RF filter 240. The RF filter is a band-pass filter that limits the bandwidth of the RF signal to the frequency range specified for the channel assigned to the transmitter 202. The bandwidth of the RF filter 240 is broader than that of the IF filter 234.

The RF filter 240 feeds the filtered RF signal to the PA 242. In the transmitter 202, the first IQ modulator 214, the first DAC 218 and the addition module 219 collectively perform the function of combining the predistortion signal generated by the predistortion signal generator 212 with the analog IF main signal generated in the main signal path 203 to generate the combined IF signal. Also in this embodiment, the RF modulator 236 and the RF filter 240 collectively perform the function of providing the combined IF signal to the PA 242 as part of the filtered RF signal.

The PA 242 amplifies the filtered RF signal to provide the transmission signal $y_{RF}(t)$. Since the analog predistortion IF signal was added to the analog main IF signal after the IF filter 234, the predistortion signal included in the predistortion IF signal cancels the signal components generated by the non-linearity of the PA 242. This substantially reduces adjacent-channel power leakage.

Figure 4:
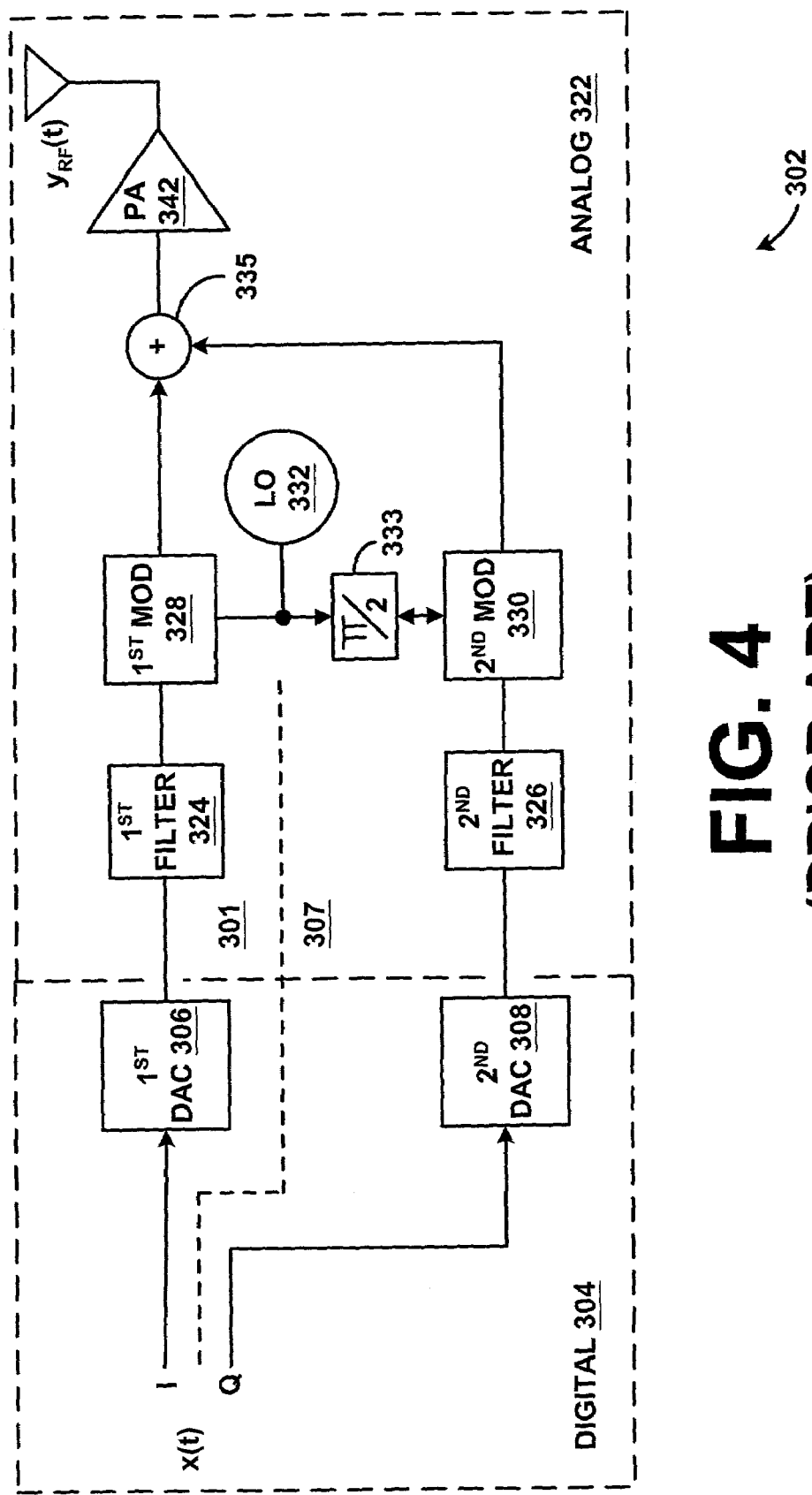
FIG. 4 is a block diagram illustrating a prior art transmitter that utilizes two baseband low-pass filters.

Prior Art Transmitter Utilizing Analog Baseband Filters Followed by Direct-to-RF Conversion Certain transmitters do not have an IF stage with an IF filter, but, instead, directly modulate the RF carrier with the input signal. Such transmitters include at least one baseband filter. The baseband filter is a low-pass filter that removes unwanted signal components, particularly noise, at the expense of limiting the bandwidth of the input signal. FIG. 4 is a block diagram illustrating a prior art transmitter 302 that includes two analog baseband filters. The transmitter 302 is composed of a digital portion 304 and an analog portion 322. The transmitter 302 is additionally composed of an in-phase signal path 301 and a quadrature signal path 307. The in-phase component of the digital input signal x(t) is processed in the in-phase signal path 301, while the quadrature component of the digital input signal x(t) is processed in the quadrature signal path 307.

The in-phase signal path 301 is composed of a first DAC 306, a first baseband filter 324 and a first RF modulator 328. The transmitter 302 is additionally composed of a local oscillator 332, a phase-inverter 333, an addition module 335 and a power amplifier (PA) 342.

In the in-phase signal path 301, the first DAC 306 receives the in-phase component of the digital input signal x(t) and converts the in-phase component from a digital signal to an analog signal, namely, an analog in-phase component. As mentioned above, an analog signal resulting from a digital-to-analog conversion typically includes quantization noise introduced by the DAC, and may additionally include other out-of-band noise. The transmitter 302 therefore includes baseband filters. The baseband filters are low-pass filters that sharply attenuate frequency components outside the defined frequency range of the digital input signal x(t).

The first DAC 306 feeds the analog in-phase component to the first baseband filter 324. The first baseband filter 324 removes unwanted signal components, such as quantization noise and other out-of-band noise. The first baseband filter 324 feeds the filtered analog in-phase component to the first RF modulator 328.

The quadrature signal path 307 is composed of a second DAC 308, a second baseband filter 326 and a second RF modulator 330. The second DAC 308 receives the quadrature component of the digital input signal x(t) and converts the quadrature component from a digital signal to an analog signal, namely, an analog quadrature component. The analog quadrature component is fed to a second baseband filter 326 that removes unwanted signal components including quantization noise and other out-of-band noise. The second baseband filter 326 feeds the filtered analog quadrature component to the second RF modulator 330.

The local oscillator 332 generates an analog RF carrier signal whose frequency defines the transmission frequency of the transmitter 302. The local oscillator 332 feeds the RF carrier frequency to the first modulator 328 and to the phase inverter 333. The phase inverter 333 inverts the phase of the RF carrier signal and feeds the resulting phase-inverted RF carrier signal to the second modulator 330.

The first RF modulator 328 modulates the RF carrier signal received from the local oscillator 332 with the filtered analog in-phase component received from the first baseband filter 324 to generate an in-phase RF signal. The second RF modulator 330 modulates the phase-inverted RF carrier signal with the filtered analog quadrature component received from the second baseband filter 326 to generate a quadrature RF signal.

The addition module 335 receives the in-phase and quadrature RF signals from the modulators 328 and 330, respectively, and combines them to form a combined RF signal. The combined RF signal includes sidebands contributed by both the in-phase component and the quadrature component of the digital input signal x(t).

The PA 342 amplifies the combined RF signal to provide the transmission signal $y_{RF}(t)$. Frequency components generated by the non-linearity of the PA 342 cause adjacent-channel power leakage.

Figure 5:
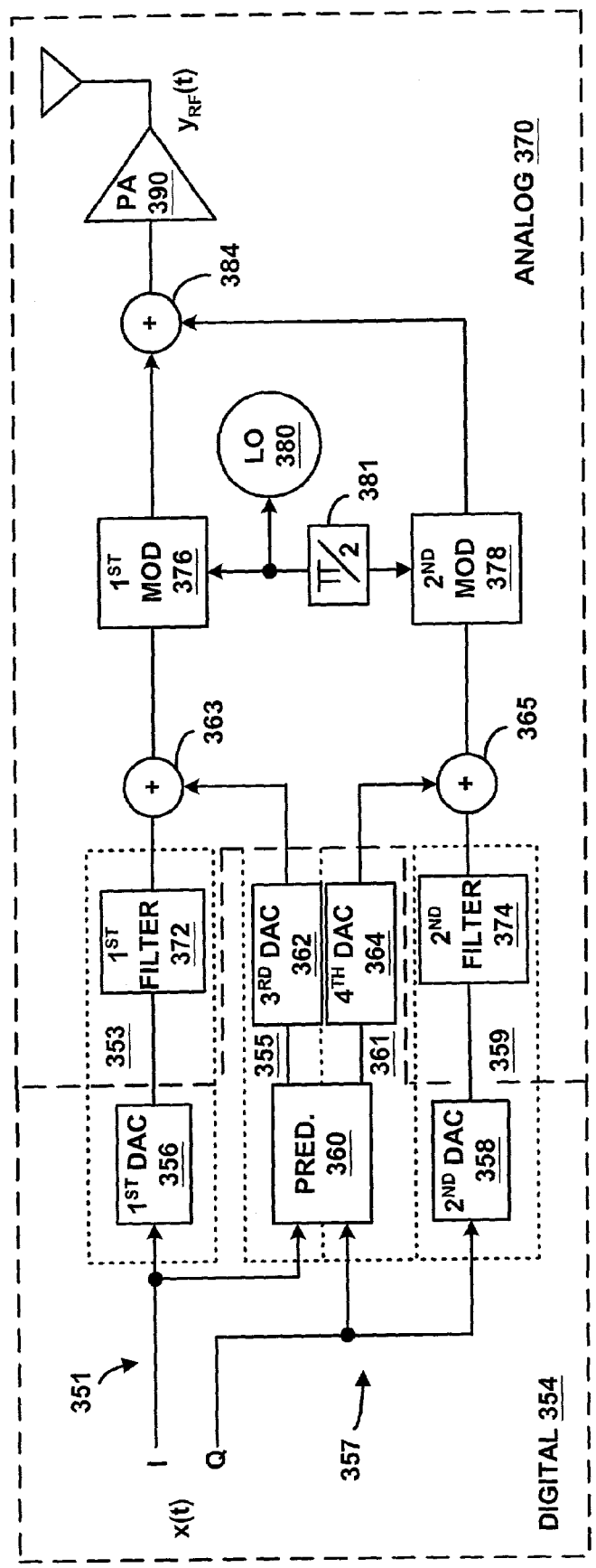
FIG. 5 is a block diagram illustrating a second exemplary embodiment of a transmitter of the invention that constitutes an improvement over the prior art transmitter of FIG. 4.

Transmitter According to the Invention Utilizing Analog Baseband Filters Followed by Direct-to-RF Conversion FIG. 5 is a block diagram showing a second exemplary embodiment 352 of a transmitter according to the invention. The transmitter 352 includes analog baseband filters. The transmitter 352 derives a digital predistortion signal from the in-phase and quadrature components, respectively, of the digital input signal x(t), generates analog predistortion signals from the digital predistortion signal and combines the analog predistortion signals with the analog main signals after the baseband filters. In this embodiment, the analog main signals and the analog predistortion signals are baseband signals. The predistortion signal includes out-of-band frequency components that are added to the main analog signals after the baseband filters to prevent the baseband filters from removing the out-of-band frequency components of the analog predistortion signals. The analog predistortion signals effectively cancel the out-of-band frequency components resulting from the non-linearity of the power amplifier, and adjacent-channel power leakage is significantly reduced.

The transmitter 352 is composed of a digital portion 354 and an analog portion 370. The transmitter 352 is also composed of an in-phase signal path 351, a quadrature signal path 357, a first addition module 363, a second addition module 365, a first RF modulator 376, a second RF modulator 378, a local oscillator 380, a phase inverter 381, a third addition module 384 and a power amplifier (PA) 390. The in-phase signal path 351 is composed of an in-phase main signal path 353 and an in-phase predistortion signal path 355. The quadrature signal path 357 is composed of a quadrature main signal path 359 and a quadrature predistortion signal path 361. The in-phase main signal path 353 is composed of a first DAC 356 and a first analog baseband filter 372. The first DAC 356 receives the in-phase component of the digital input signal x(t) and converts the in-phase component from a digital signal to an analog signal, namely, an in-phase component of an analog main signal. As mentioned above, an analog signal resulting from a digital-to-analog conversion typically includes quantization noise and may additionally include other out-of-band noise. The transmitter 352 therefore includes baseband filters in the analog portions of the main signal paths 353 and 359. The baseband filters are low-pass filters that sharply attenuate frequency components outside the defined frequency range of the digital input signal x(t).

The first DAC 356 feeds the in-phase component of the analog main signal to the first analog baseband filter 372. The first analog baseband filter 372 filters the in-phase component of the analog main signal to remove unwanted signal components, including quantization noise and other out-of-band noise. The first analog baseband filter 372 feeds the filtered in-phase component of the analog main signal to the first addition module 363.

The quadrature main signal path 359 is composed of a second DAC 358 and a second analog baseband filter 374. The second DAC 358 receives the quadrature component of the digital input signal x(t) and converts the quadrature component from a digital signal to an analog signal, namely, the quadrature component of the analog main signal. The second DAC 358 feeds the quadrature component of the analog main signal to the second analog baseband filter 374. The second analog baseband filter 374 filters the quadrature component of the analog main signal to remove unwanted signal components, including quantization noise and other out-of-band noise. The second analog baseband filter 374 feeds the filtered quadrature component of the analog main signal to the second addition module 365.

The predistortion signal paths, namely, the in-phase predistortion signal path 355 and the quadrature predistortion signal path 361, will now be described. The predistortion signal generator 360 is common to both predistortion signal paths 355, 361. The predistortion signal generator 360 digitally processes the in-phase component and quadrature component of the digital input signal x(t) to derive a digital predistortion signal having an in-phase component and a quadrature component. The predistortion signal models an inverse of the non-linearity of the PA 390. To derive the predistortion signal, the predistortion signal generator 360 processes the digital input signal x(t) using, for example, a power series such as, but not limited to, a Taylor series. Alternatively, the predistortion signal generator 360 may use another non-linear transform function known in the art. Examples of non-linear transform functions are described by Allen Katz, "Linearization: Reducing Distortion in Power Amplifiers," *IEEE Microwave Magazine*, vol. 2, issue 4, pp. 37–49 (December 2001).

The in-phase predistortion signal path 355 is additionally composed of the third DAC 362. The quadrature predistortion signal path 361 is additionally composed of a fourth DAC 364.

The in-phase predistortion signal path 355 receives the in-phase component (I) of the digital input signal x(t) while the quadrature predistortion signal path 361 receives the quadrature component (Q) of the digital input signal x(t). The predistortion signal generator 360 digitally processes the components I and Q of the digital input signal x(t) to derive the digital predistortion signal composed of an in-phase component and a quadrature component.

The in-phase component of the predistortion signal is fed to the third DAC 362, while the quadrature component of the predistortion signal is fed to the fourth DAC 364. The third DAC 362 converts the in-phase component of the predistortion signal to an analog signal, namely, an in-phase component of an analog predistortion signal. The fourth DAC 364 converts the quadrature component of the predistortion signal to an analog signal, namely, the quadrature component of the analog predistortion signal.

The first addition module 363 combines the in-phase component of the analog predistortion signal output by the in-phase predistortion signal path 355 and the in-phase component of the analog main signal output by the in-phase main signal path 353 to generate an in-phase component of an analog combined signal, which is a baseband signal. The second addition module 365 combines the quadrature component of the analog predistortion signal output by the quadrature predistortion signal path 361 and the quadrature component of the analog main signal output by the quadrature main signal path 359 to generate the quadrature component of the analog combined signal, which is a a baseband analog signal. The in-phase and quadrature components of the analog predistortion signal are added to the in-phase and quadrature components, respectively, of the analog main signal after the analog baseband filters 372, 374. Addition after the analog baseband filters 372, 374 prevents the analog baseband filters 372, 374 from removing the out-of-band frequency components from the components of the analog predistortion signal prior to the combining of the components of the analog predistortion signal and the respective components of the analog main signal. The components of the predistortion signal therefore include the out-of-band frequency components that originally constituted part of the digital predistortion signal.

The local oscillator 380 generates an RF carrier signal whose frequency defines the transmission frequency of the transmitter 352. The local oscillator 380 feeds the RF carrier signal to the first RF modulator 376 and to the phase inverter 381. The phase inverter 381 inverts the phase of the RF carrier signal and feeds the resulting phase-inverted RF carrier signal to the second RF modulator 378.

The first RF modulator 376 modulates the RF carrier signal received from the local oscillator 380 with the in-phase component of the analog combined signal received from the first addition module 363 to generate an in-phase RF signal. The second RF modulator 378 modulates the phase-inverted RF carrier signal received from the phase inverter 381 with the quadrature component of the analog combined signal received from the second addition module 365 to generate a quadrature RF signal.

The third addition module 384 sums the in-phase RF signal received from the first RF modulator 376 and the quadrature RF signal received from the second RF modulator 378 to generate a combined RF signal that includes sidebands contributed by the in-phase and quadrature components of the analog combined signal.

The third addition module 384 feeds the combined RF signal to the PA 390. In the transmitter 352, the third DAC 362 and the first addition module 363 collectively perform the function of combining the in-phase component of the predistortion signal with the in-phase component of the main signal output by the in-phase main signal path 353 to generate the in-phase component of the combined signal. Similarly, the fourth DAC 364 and the second addition module 365 collectively perform the function of combining the quadrature component of the predistortion signal with the quadrature component of the main signal output by the quadrature main signal path 359 to generate the quadrature component of a combined signal. Finally, the first RF modulator 376, the second RF modulator 378 and the third addition module 384 collectively perform the function of providing the combined signal to the power amplifier 390 by modulating the RF carrier with the in-phase component and modulating the phase-inverted RF carrier with the quadrature component and adding the resulting RF signals to generate the combined RF signal that is provided to the PA.

The PA 390 amplifies the combined RF signal to provide the transmission signal $y_{RF}(t)$. The predistortion signal included in the combined RF signal cancels the signal components added to the transmission signal by the non-linearity of the PA 390. This significantly reduces adjacent-channel power leakage.

Figure 6:
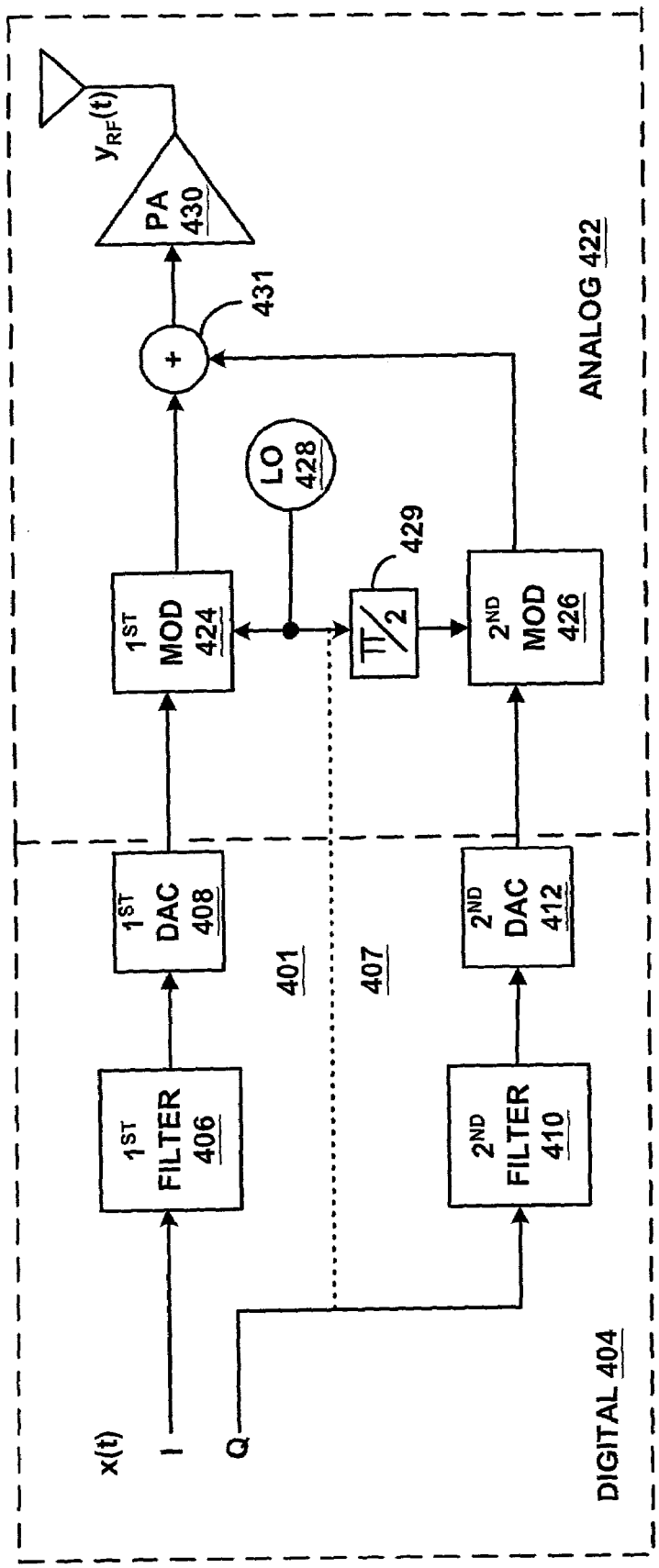
FIG. 6 is a block diagram illustrating a prior art transmitter that utilizes two digital baseband low-pass filters.

Prior Art Transmitter Utilizing Digital Baseband Filters Followed by Direct-to-RF Conversion Certain transmitters include digital baseband filters instead of the analog baseband filters described above with reference to FIG. 4. FIG. 6 is a block diagram illustrating a prior art transmitter that utilizes two digital baseband filters. The transmitter 402 of FIG. 6 is composed of a digital portion 404 and an analog portion 422. The transmitter 402 is additionally composed of an in-phase signal path 401, a quadrature signal path 407, a local oscillator 428, a phase inverter 429, an addition module 431 and a power amplifier (PA) 430. The in-phase component (I) of the digital input signal x(t) is processed in the in-phase signal path, and the quadrature component (Q) of the input signal x(t) is processed in the quadrature signal path 407.

The in-phase transmission path 401 is composed of a first digital baseband filter 406, a first DAC 408, a first RF modulator 424, the addition module 431 and the power amplifier (PA) 430. The first digital baseband filter 406 receives the in-phase component (I) of the digital input signal x(t). The first digital baseband filter 406 digitally filters the in-phase component to remove unwanted signal components such as, but not limited to, noise.

The first digital baseband filter 406 feeds the digital filtered in-phase component to the first DAC 408. The first DAC 408 converts the digital filtered in-phase component into an analog signal, namely, an analog in-phase component.

The quadrature signal path 407 is composed of a second digital baseband filter 410, a second DAC 412 and a second RF modulator 426. The second digital baseband filter 410 receives the quadrature component Q of the digital input signal x(t). The second digital baseband filter 410 digitally filters the quadrature component to remove unwanted signal components such as, but not limited to, noise.

The second digital baseband filter 410 feeds the digital filtered quadrature component to the second DAC 412. The second DAC 412 converts the digital filtered quadrature component into an analog signal, namely, an analog quadrature component.

The digital portion 404 of the transmitter 402 is configured to operate with quantities, e.g., digital words, having substantially more bits than the digital portions of the transmitters shown in FIGS. 1 and 4. The larger number of bits preserves the dynamic range of the analog in-phase component and the analog quadrature component notwithstanding the lack of post-conversion analog filtering applied to these analog components. As a result, the elements constituting the digital portion 404 are more complex to implement than the elements constituting the digital portions of the transmitters shown in FIGS. 1 and 4.

In the analog portion 422 of the transmitter 402, the local oscillator 428 generates an RF carrier signal whose frequency defines the transmission frequency of the transmitter 402. The local oscillator feeds the RF carrier signal to the first RF modulator 424 and to the phase inverter 429. The phase inverter 429 inverts the phase of the RF carrier signal and feeds the resulting phase-inverted RF carrier signal to the second RF modulator 426.

The first RF modulator 424 modulates the RF carrier signal received from the local oscillator 428 with the analog in-phase component received from the first DAC 408 to generate an in-phase RF component. The second RF modulator 426 modulates the phase-inverted RF carrier signal received from the phase inverter 429 with the analog quadrature component received from the second DAC 412 to generate a quadrature RF component. The first and second modulators 424, 426 directly modulate the RF carrier signal with the analog in-phase and quadrature components respectively derived from the in-phase and quadrature components of the digital input signal.

The addition module 431 receives the in-phase and quadrature RF components from the modulators 424 and 426, respectively, and sums the RF components to form a combined RF signal.

The PA 430 amplifies the combined RF signal to provide a transmission signal. In this prior-art transmitter, frequency components generated by the non-linearity of the PA 430 cause adjacent channel power leakage.

Figure 7:
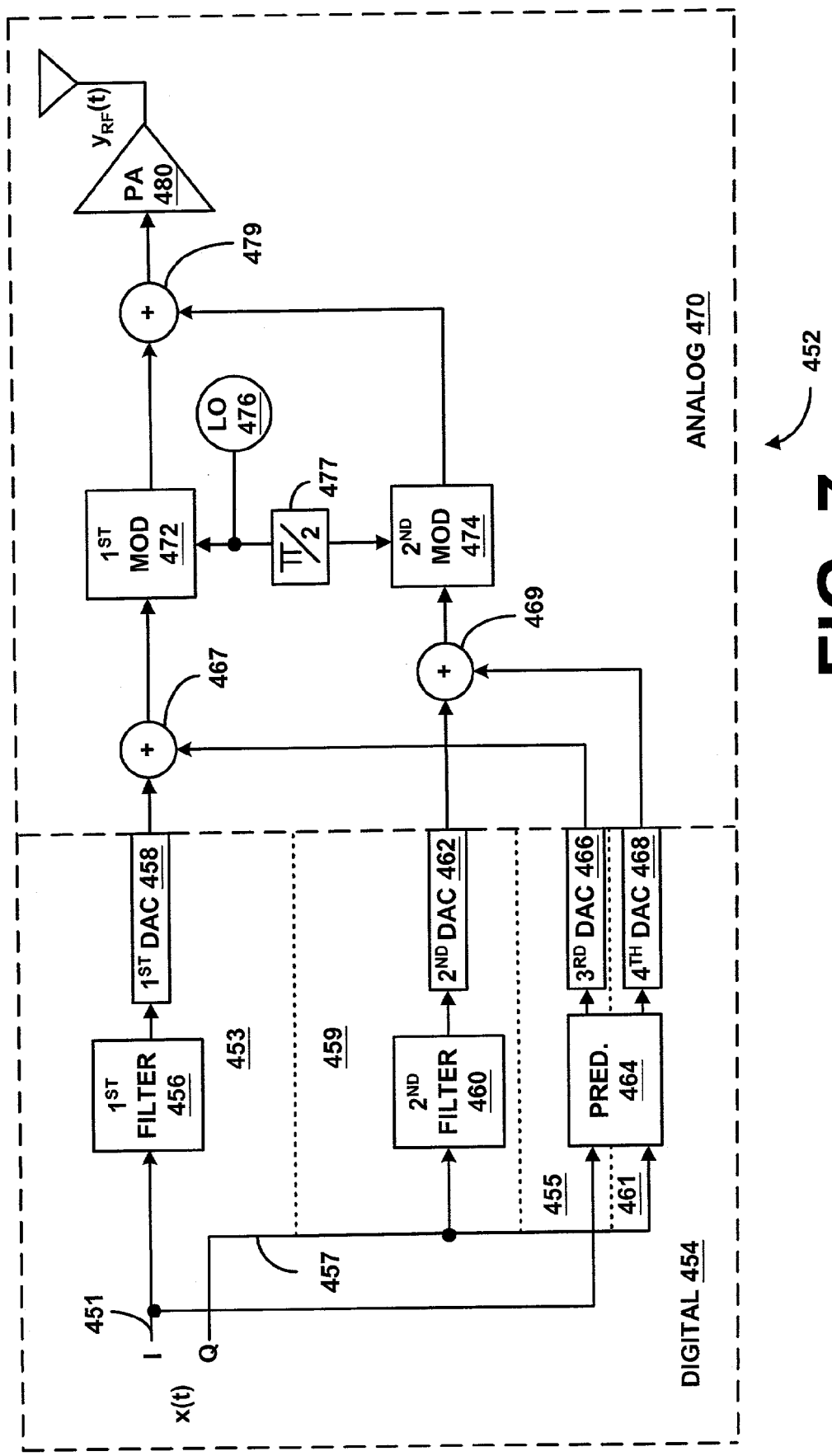
FIG. 7 is a block diagram illustrating a third exemplary embodiment of a transmitter of the invention that constitutes an improvement over the prior art transmitter of FIG. 6.

Transmitter According to the Invention Utilizing Digital Baseband Followed by Direct-to-RF Conversion FIG. 7 is a block diagram showing a third exemplary embodiment 452 of a transmitter according to the invention. In the transmitter 452, the frequency components generated by the non-linearity of the PA are cancelled by predistortion signal components combined with the main signal components prior to the RF modulators.

The transmitter 452 is composed of a digital portion 454 and an analog portion 470. The transmitter 452 is also composed of an in-phase signal path 451, a quadrature signal path 457, a first addition module 467, a second addition module 469, a first RF modulator 472, a second RF modulator 474, a local oscillator 476, a phase inverter 477, a third addition module 479 and a power amplifier (PA) 480. The in-phase signal path 451 is composed of an in-phase main signal path 453 and an in-phase predistortion signal path 455. The quadrature signal path 457 is composed of a quadrature main signal path 459 and a quadrature predistortion signal path 461.

The in-phase main signal path 453 is composed of a first digital baseband filter 456 and a first DAC 458. The first digital baseband filter 456 is a low-pass filter that sharply attenuates frequency components outside the defined frequency range of the digital input signal x(t). The first digital baseband filter 456 receives the in-phase component (I) of the digital input signal x(t) and digitally filters the in-phase component to remove unwanted signal components.

The first digital baseband filter 456 feeds the filtered in-phase component to the first DAC 458. The first DAC 458 converts the filtered digital in-phase component to an analog signal, namely, an in-phase component of an analog main signal, and feeds the in-phase component of the analog main signal to the first addition module 467.

The quadrature main signal path 459 is composed of the second digital baseband filter 460 and the second DAC 462. The second digital baseband filter 460 is a low-pass filter that sharply attenuates frequency components outside the defined frequency range of the digital input signal. The second digital baseband filter 460 receives the quadrature component (Q) of the digital input signal x(t) and digitally filters the quadrature component to remove unwanted frequency components. The second digital baseband filter 460 feeds the filtered quadrature component to the second DAC 462. The second DAC 462 converts the filtered digital quadrature component to an analog signal, namely, the quadrature component of the analog main signal, and feeds the quadrature component of the analog main signal to the second addition module 469.

The digital portion 454 of the transmitter 452 is configured to operate with quantities, e.g., digital words, having substantially more bits than the digital portions of the transmitters shown in FIGS. 3 and 5. The larger number of bits preserves the dynamic range of the in-phase and quadrature components of the analog main signal notwithstanding the lack of post-conversion analog filtering applied to these components of the analog main signal. As a result, the elements constituting the digital portion 454 are more complex to implement than the elements constituting the digital portions of the transmitters shown in FIGS. 3 and 5.

The predistortion signal paths, namely, the in-phase predistortion signal path 455 and the quadrature predistortion signal path 461 will now be described. The predistortion signal generator 464 is common to both predistortion signal paths. The predistortion signal generator digitally processes the in-phase component and the quadrature component of the digital input signal x(t) to derive a digital predistortion signal having an in-phase component and a quadrature component. The predistortion signal models an inverse of the non-linearity of the PA 480. To derive the predistortion signal, the predistortion signal generator 464 processes the digital input signal using, for example, a power series such as, but not limited to, a Taylor series. Alternatively, the predistortion signal generator 464 may process the digital input signal using another non-linear transform function known in the art. Examples of non-linear transform functions are described by Allen Katz, "Linearization: Reducing Distortion in Power Amplifiers," *IEEE Microwave Magazine*, vol. 2, issue 4, pp. 37–49 (December 2001).

The predistortion signal generator 464 outputs the in-phase and quadrature components of the digital predistortion signal separately. The predistortion signal generator feeds the in-phase component of the digital predistortion signal to the fourth DAC 468 located in the in-phase predistortion signal path 455, and feeds the quadrature component of the digital predistortion signal to the third DAC 466 located in the quadrature predistortion signal path 461.

The digital predistortion signal generated by the predistortion signal generator 464 has a high sampling rate to enable the signal to accurately represent the out-of-band frequency components. Consequently, the third DAC 466 and the fourth DAC 468 typically have a sampling rate greater than that of the first DAC 458 and the second DAC 462. On the other hand, the dynamic range requirements for the third and fourth DACs 466, 468 are lower than the dynamic range requirements for the first and second DACs 458, 462.

The third DAC 466 converts the in-phase component of the digital predistortion signal into an analog signal, namely, an in-phase component of an analog predistortion signal, and feeds the in-phase component of the analog predistortion signal to the first addition module 467. The fourth DAC 468 converts the quadrature component of the digital predistortion signal into an analog signal, namely, the quadrature component of the analog predistortion signal, and feeds the quadrature component of the analog predistortion signal to the second addition module 469.

The first addition module 467 combines the in-phase component of the analog predistortion signal output by the in-phase predistortion signal path 455 and the in-phase component of the analog main signal output by the in-phase main path 453 to generate an in-phase component of a combined signal. The second addition module 469 combines the quadrature component of the analog predistortion signal output by the quadrature predistortion signal path 461 and the quadrature component of the analog main signal output by the quadrature main signal path 459 to generate the quadrature component of the combined signal.

The predistortion signal generator 464 digitally derives the digital predistortion signal from the digital input signal ahead of the digital baseband filters 456 and 460. The addition modules 467, 469 that combine the in-phase and quadrature components of the analog predistortion signal and the in-phase and quadrature components, respectively, of the analog main signal derived by digitally filtering the digital input signal are located after the digital baseband filters 456, 460, but prior to the RF modulators 472 and 474. In the analog portion 470, the local oscillator 476 generates an RF carrier signal whose frequency defines the transmission frequency of the transmitter 452. The local oscillator 476 feeds the RF carrier signal to the first RF modulator 472 and the phase inverter 477. The phase inverter 477 inverts the phase of the RF carrier signal and feeds the resulting inverted-phase RF carrier to the second RF modulator 474.

The first RF modulator 472 modulates the RF carrier signal received from the local oscillator 476 with the in-phase component of the combined signal received from the first addition module 467 to generate an in-phase RF signal. The second RF modulator 474 modulates the phase-inverted RF carrier signal received from the phase inverter 477 with the quadrature component of the combined signal received from the second addition module 469 to generate a quadrature RF signal. The third addition module 479 sums the in-phase RF signal received from the first RF modulator 472 with the quadrature RF signal received from the second RF modulator 474 to generate a combined RF signal that includes sidebands contributed by the in-phase and quadrature components of the analog combined signal.

The third addition module 479 feeds the combined RF signal to the PA 480. In the transmitter 452, the in-phase signal path 451 and the first addition module 467 collectively perform the function of combining the in-phase component of the predistortion signal with the in-phase component of the main signal output by the in-phase main signal path 453 to generate the in-phase component of the combined signal. Similarly, in the quadrature signal path 457, the fourth DAC 468 and the second addition module 469 collectively perform the function of combining the quadrature component of the predistortion signal with the quadrature component of the main signal output by the quadrature main signal path 459 to generate the quadrature component of a combined signal. Finally, the first RF modulator 472, the second RF modulator 474 and the third addition module 479 collectively perform the function of providing the combined signal to the power amplifier 480 by modulating the RF carrier with the in-phase component and modulating the phase-inverted RF carrier with the quadrature component and adding the resulting RF signals to generate the combined RF signal that is provided to the PA 480.

The PA 480 amplifies the combined RF signal to provide the transmission signal $y_{RF}(t)$. The predistortion signal included in the combined RF signal amplified by the PA 480 cancels the signal components added to the transmission signal by the non-linearity of the PA 480. Adjacent-channel power leakage is therefore substantially reduced.

Figure 8:
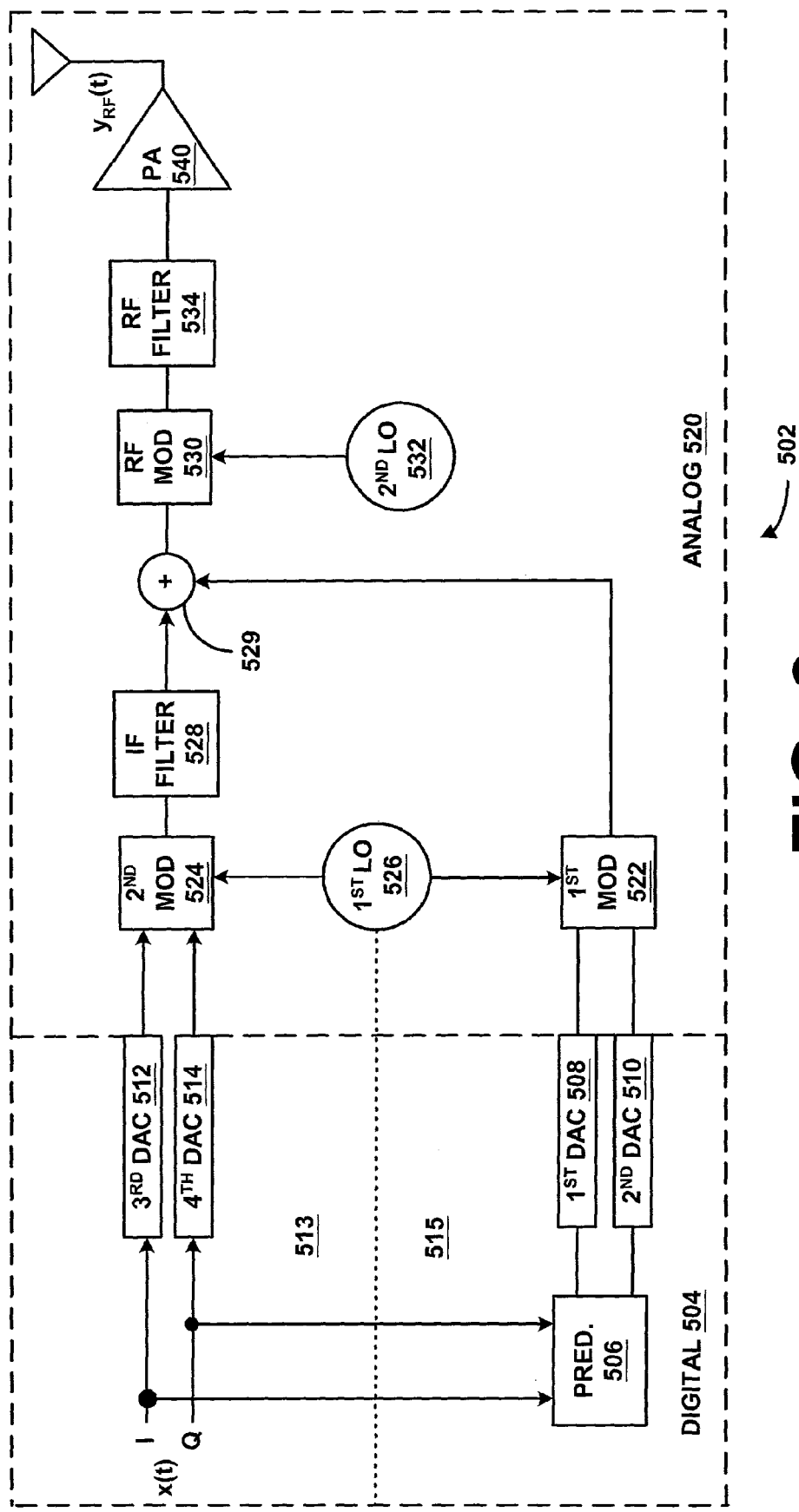
FIG. 8 is a block diagram illustrating a fourth exemplary embodiment of the transmitter of the invention, in which the IF conversion is performed in the analog domain.

Transmitter According to the Invention Utilizing Analog IF Modulation and IF Filter FIG. 8 is a block diagram of a fourth exemplary embodiment 502 of a transmitter according to the invention. In contrast to the transmitter described above with reference to FIG. 3, the IF carrier signal is modulated with the input signal and the predistortion signal in the analog portion of the transmitter 502. The transmitter 502 digitally derives a digital predistortion signal from the digital input signal x(t), generates an analog predistortion signal from the digital predistortion signal and combines the analog predistortion signal and the analog main signal after the analog main signal has been filtered by an IF filter.

The digital predistortion signal has a higher sampling frequency than the digital input signal to enable it to represent the out-of-band frequency components of the distortion generated by the power amplifier with an accuracy sufficient for the predistortion signal to provide an effective reduction of the effects of the non-linearity of the power amplifier. Adding the predistortion IF signal to the main IF signal after the main IF signal has been filtered by the IF filter prevents the IF filter from removing out-of-band frequency components of within the predistortion signal.

The transmitter 502 is composed of a digital portion 504 and an analog portion 520. The transmitter 502 is additionally composed of a main signal path 513 a predistortion signal path 515, a first local oscillator 526, an addition module 529, an RF modulator 530, a second local oscillator 532, an RF filter 534 and a power amplifier (PA) 540.

The predistortion signal path 515 is composed of a predistortion signal generator 506, a first DAC 508, a second DAC 510 and a first IQ modulator 522. The predistortion signal generator 506 digitally processes the in-phase component (I) and the quadrature component (Q) of the digital input signal x(t) to derive a digital predistortion signal having an in-phase component and a quadrature component. The digital predistortion signal models an inverse of the non-linearity of the PA 540.

To derive the digital predistortion signal, the predistortion signal generator 506 digitally processes the digital input signal x(t) using a power series such as, but not limited to, a Taylor series. The predistortion signal generator 506 may process the digital input signal using another non-linear transform function known in the art. Examples of non-linear transform functions are described by Allen Katz, "Linearization: Reducing Distortion in Power Amplifiers," *IEEE Microwave Magazine*, vol. 2, issue 4, pp. 37–49 (December 2001). The predistortion signal generator 506 outputs the in-phase and quadrature components of the digital predistortion signal separately.

The predistortion signal generator 506 feeds the in-phase component of the digital predistortion signal to the first DAC 508 and feeds the quadrature component of the digital predistortion signal to the second DAC 510. The first DAC 508, converts the in-phase component of the digital predistortion signal from a digital signal to an analog signal, namely, an in-phase component of an analog predistortion signal. The second DAC 510 converts the quadrature component of the digital predistortion signal from a digital signal to an analog signal, namely, the quadrature component of the analog predistortion signal. The first and second DACs 508, 510 feed the in-phase and quadrature components, respectively, of the analog predistortion to the analog portion 520, and specifically to the first IQ modulator 522. The first IQ modulator also receives the IF carrier signal, an analog signal, from the first local oscillator 526. The first IQ modulator 522 modulates the IF carrier signal with the in-phase and quadrature components of the analog predistortion signal to generate a predistortion IF signal. The predistortion IF signal includes sidebands contributed by the in-phase and quadrature components of the analog predistortion signal and has a frequency substantially higher than the frequency range of the analog predistortion signal. The first IQ modulator 522 modulates the IF carrier signal in a manner that allows both the in-phase and the quadrature components of the analog predistortion signal to be carried by a single channel. The first IQ modulator 522 feeds the predistortion IF signal to the addition module 529.

The main signal path 513 is composed of a third DAC 512, a fourth DAC 514, a second IQ modulator 524 and an IF filter 528. The third DAC 512 and the fourth DAC 514 receive the in-phase component (I) and the quadrature component (Q), respectively, of the digital input signal x(t) and convert the components of the input signal from digital signals to analog signals, namely, an in-phase component and a quadrature component, respectively, of an analog quadrature main signal. The third DAC 512 and the fourth DAC 514 feed the in-phase and quadrature components of the analog main signal to the second IQ modulator 524. The second IQ modulator 524 additionally receives the IF carrier signal from the first local oscillator 526.

The second IQ modulator 524 modulates the IF carrier signal with the in-phase and the quadrature components of the analog main signal to generate a main IF signal. The main IF signal is an analog signal that includes sidebands contributed by the in-phase and quadrature components of the analog main signal and has a frequency substantially higher than the frequency range of the analog main signal. The frequency range of the sidebands contributed to the main IF signal by the components of the analog main signal is less than that of the sidebands contributed to the predistortion IF signal by the components of the analog predistortion signal. The second IQ modulator 524 modulates the IF carrier signal in a manner that allows both the in-phase and the quadrature components of the analog main signal to be carried in a single channel.

The second IQ modulator 524 feeds the main IF signal to the IF filter 528. The IF filter 528 is a band-pass filter that removes unwanted signal components from the main IF signal. The unwanted signal components removed from the main IF signal include quantization noise and other out-of-band signal components contributed by the third and fourth DACs 512, 514. Specifically, the IF filter 528 limits the bandwidth of the main IF signal to the frequency range of the sidebands contributed by the digital input signal x(t). However, the IF filter 528 has no effect on the predistortion IF signal since the predistortion IF signal is combined with the main IF signal after the IF filter 528. As a result, the IF filter 528 does not remove the out-of-band frequency components from the predistortion IF signal.

The IF filter 528 feeds the filtered main IF signal to the addition module 529. The addition module adds the predistortion IF signal and the main IF signal to generate a combined IF signal capable of canceling the signal components generated by the nonlinearity of the PA 540.

The addition module 529 feeds the combined IF signal to an RF modulator 530. The RF modulator 530 additionally receives the RF carrier signal generated by the second local oscillator 532. The frequency of the RF carrier defines the transmission frequency of the transmitter 502. The RF modulator 530 modulates the RF carrier signal received from second local oscillator 532 with the combined IF signal received from the addition module 529 to generate an RF signal. The RF modulator 530 feeds the RF signal to the RF filter 534. The RF filter 534 is a band-pass filter that limits the bandwidth of the RF signal to the frequency range specified for the channel assigned to the transmitter 502. The bandwidth of the RF filter 534 is broader than that of the IF filter 528.

The RF filter 534 feeds the filtered RF signal to the PA 540. In the transmitter 502, the first DAC 508, the second DAC 510, the first IQ modulator 522, and the addition module 529 collectively perform the function of combining the predistortion signal generated by the predistortion signal generator 506 with the analog IF main signal generated in the main signal path 513 to generate the combined IF signal. Also, the RF modulator 530 and the RF filter 534 collectively perform the function of providing the combined IF signal to the power amplifier 540 as part of the filtered RF signal.

The PA 540 amplifies the filtered RF signal to provide the transmission signal $y_{RF}(t)$. Since the predistortion IF signal was added to the main IF signal after the IF filter 528, the predistortion signal included in the filtered RF signal amplified by the PA 540 cancels the signal components generated by the non-linearity of PA 540. As a result, adjacent channel power leakage is substantially reduced.

Digital Transmitter According to the Invention

Figure 9:
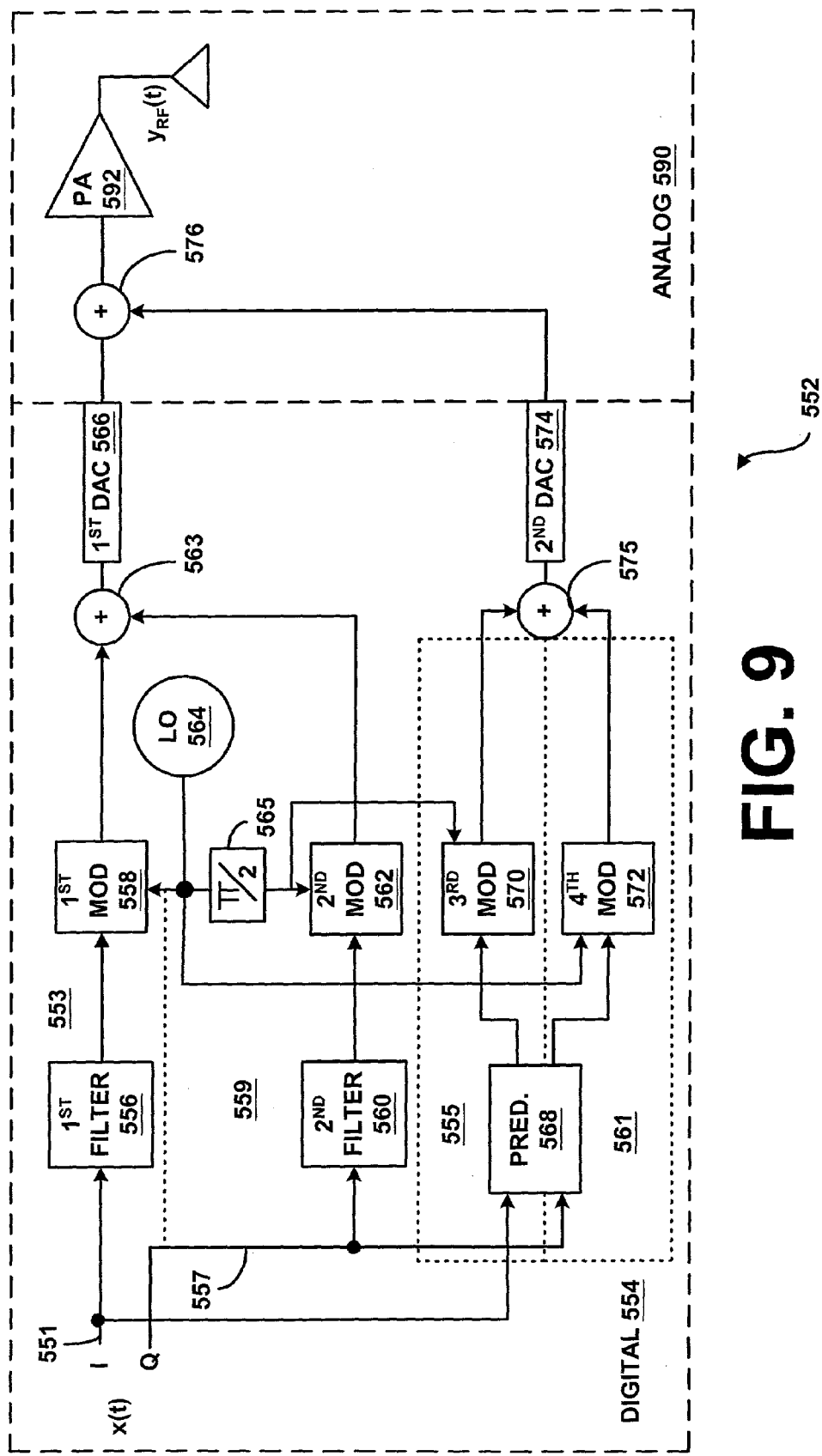
FIG. 9 is a block diagram illustrating a fifth exemplary embodiment of the invention in which most of the circuitry of the transmitter is digital circuitry.

Digital circuitry is typically less expensive than analog circuitry. FIG. 9 is a block diagram of a fifth exemplary embodiment 522 of a transmitter according to the invention in which most of the circuitry of the transmitter is located in the digital portion of the transmitter. The transmitter 552 is composed of a digital portion 554 and an analog portion 590. The transmitter 552 is also composed of an in-phase signal path 551, a quadrature signal path 557, a local oscillator 564, a phase inverter 565, an analog addition module 576 and a power amplifier (PA) 592. The in-phase signal path is composed of an in-phase main signal path 553 and an in-phase predistortion signal path 555. The quadrature signal path 557 is composed of a quadrature main signal path 559 and a quadrature predistortion signal path 561.

The in-phase main signal path 553 is composed of the first digital baseband filter 556, a first RF modulator 558, a first digital addition module 563, a first DAC 566, all of which are digital elements. The first digital baseband filter 556 is a low-pass filter that sharply attenuates frequency components outside the defined frequency range of the digital input signal. The first digital baseband filter 556 receives the in-phase component (I) of the digital input signal x(t) and digitally filters the in-phase component to remove unwanted frequency components, and feeds the digital filtered in-phase component to the first RF modulator 558.

The quadrature main signal path 559 is composed of a second digital baseband filter 560 and a second RF modulator 562, both of which are digital elements. The second digital baseband filter 560 is a low-pass filter that sharply attenuates frequency components outside the defined frequency range of the digital input signal. The second digital baseband filter 560 receives the quadrature component (Q) of the digital input signal x(t). The second digital baseband filter 560 digitally filters the quadrature component to remove unwanted frequency components, and feeds the digital filtered quadrature component to the second RF modulator 562.

The first RF modulator 558 receives the digital filtered in-phase component from the first digital baseband filter 556 and additionally receives a digital RF carrier signal from the local oscillator 564. The local oscillator 564 additionally feeds the digital RF carrier signal to the phase inverter 565.

The phase inverter 565 inverts the phase of the digital RF carrier signal to generate a phase-inverted digital RF carrier signal. The first RF modulator 558 digitally modulates the digital RF carrier signal with the digital filtered in-phase component to generate an in-phase component of a digital main RF signal, and feeds the in-phase component of the digital main RF signal to the first digital addition module 563.

The second RF modulator 562 receives the digital filtered quadrature component from the second digital baseband filter 560 and additionally receives the phase-inverted digital RF carrier signal from the phase inverter 565. The second RF modulator 562 digitally modulates the phase-inverted digital RF carrier signal with the digital filtered quadrature component to generate the quadrature component of the digital main RF signal, and feeds the quadrature component of the digital main RF signal to the first digital addition module 563.

The first digital addition module 563 digitally combines the in-phase component of the digital main RF signal and the quadrature component of the digital main RF signal to generate a digital main RF signal. The first digital addition module 563 feeds the digital main RF signal to the first DAC 566. The first DAC 566 converts the digital main RF signal from a digital signal to an analog signal, namely, an analog main RF signal, and feeds the analog main RF signal to the analog addition module 576.

The predistortion signal generator 568 is common to the in-phase predistortion signal path 555 and the quadrature predistortion signal path 561. The in-phase predistortion signal path 555 is additionally composed of a third RF modulator 570, a second digital addition module 575 and a second DAC 574, all of which are digital elements. The quadrature predistortion signal path 561 is composed of a fourth RF modulator 572, which is a digital element.

The predistortion signal generator 568 digitally processes the in-phase component (I) and the quadrature component (Q) of the digital input signal x(t) to derive a digital predistortion signal having an in-phase component and a quadrature component. The predistortion signal models an inverse of the non-linearity of the PA 592 located within the transmitter 552.

To derive the digital predistortion signal, the predistortion signal generator 568 digitally processes the digital input signal x(t) using a power series such as, but not limited to, a Taylor series. The predistortion signal generator 568 may alternatively process the digital input signal using another non-linear transform function known in the art. Examples of non-linear transform functions are described by Allen Katz, "Linearization: Reducing Distortion in Power Amplifiers," *IEEE Microwave Magazine*, vol. 2, issue 4, pp. 37–49 (December 2001). The predistortion signal generator 568 outputs the in-phase and quadrature components of the digital predistortion signal separately.

The predistortion signal generator 568 feeds the in-phase component of the digital predistortion signal to the third RF modulator 570, and feeds the quadrature component of the digital predistortion signal to the fourth RF modulator 572. The third RF modulator 570 additionally receives the digital RF carrier signal from the local oscillator 564 and digitally modulates the digital RF carrier with the in-phase component of the digital predistortion signal to generate an in-phase component of a digital predistortion RF signal. The third RF modulator 570 feeds the in-phase component of the digital predistortion RF signal to the second digital addition module 575.

The third RF modulator 570 additionally receives the phase-inverted digital RF carrier signal from the phase inverter 565 and digitally modulates the phase-inverted digital RF carrier with the quadrature component of the digital predistortion signal to generate the quadrature component of the digital predistortion RF signal. The fourth RF modulator 572 feeds the quadrature component of the digital predistortion RF signal to the second digital addition module 575.

The second digital addition module 575 adds the in-phase component of the digital predistortion RF signal received from the third RF modulator 570 and the quadrature component of the digital predistortion RF signal received from the fourth RF modulator 572 to generate a digital predistortion RF signal.

The second digital addition module 575 feeds the digital predistortion RF signal to the second DAC 574. The second DAC 574 converts the digital predistortion RF signal from a digital signal to an analog signal, namely, an analog predistortion RF signal.

The second DAC 574 feeds the analog predistortion RF signal to the analog addition module 576. The analog addition module 576 combines the analog main RF signal received from the first DAC 566 and the analog predistortion RF signal received from the second DAC 574 to generate a combined RF signal.

The analog addition module 576 feeds the combined RF signal to the PA 592. In the transmitter 552, the third RF modulator 570, the fourth RF modulator 472, the second digital addition module 575, the second DAC 574 and the analog addition module 576 collectively perform the function of combining the predistortion signal generated by the predistortion signal generator 568 with the main signal output by the main signal path 553 to generate the combined RF signal. The analog addition module 576 additionally performs the function of providing the combined RF signal to the PA 592.

The PA 592 amplifies the combined RF signal to provide the transmission signal $y_{RF}(t)$. The analog addition module 576 that combines predistortion RF signal and the main RF signal is located between the baseband filters 556, 560 that filter the digital input signal x(t) and the PA 592. As a result, the out-of-band signal components in the predistortion signal are not filtered out and therefore are present in the combined RF signal. The combined RF signal amplified by the PA 592 is therefore capable of canceling the signal components introduced by the non-linearity of the PA 592, and the adjacent-channel power leakage is therefore substantially reduced.

Figure 10:
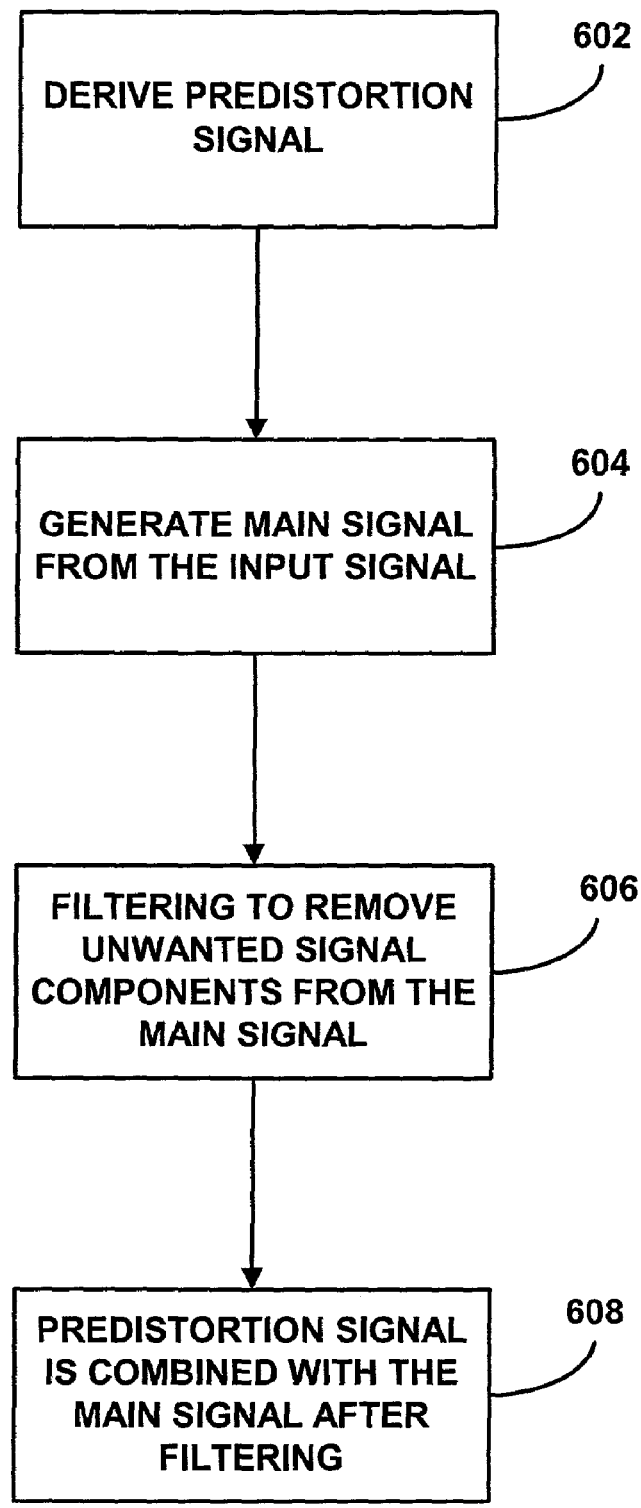
FIG. 10 is a flow chart illustrating a method for applying baseband-derived predistortion according to the invention.

FIG. 10 is a flow chart illustrating a method for applying baseband-derived predistortion to a power amplifier having non-linearity. It should also be noted that in some alternative implementations, the functions noted in the blocks may occur out of the order noted. For example, two blocks shown in succession may in fact be executed substantially concurrently, or the blocks may sometimes be executed in the reverse order, depending upon the functionality involved.

Baseband predistortion is applied to a PA having non-linearity that is located within a transmitter comprises an analog portion, a digital portion, and a power amplifier, wherein application of baseband predistortion comprises the following steps. A predistortion signal that models an inverse of non-linearities provided by the power amplifier is derived from an input signal (block 602). A main signal is generated from the input signal (block 604). Filtering is performed to remove unwanted signal components from the main signal (block 606). The predistortion signal is combined with the main signal after the filtering to generate a combined signal for driving the power amplifier (block 608).

The above-described embodiments of the transmitter can be implemented in hardware, software, firmware, or one or more combinations thereof. For example, the IF and RF components are implemented in hardware and the predistortion signal generator is implemented in software that is stored in a memory and that is executed by a suitable instruction execution system. In an embodiment, the predistortion signal generator was implemented in software running on a digital signal processor (DSP). The predistortion signal generator may alternatively be implemented in hardware. The digital portions of the transmitter may be implemented in discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

It should be emphasized that the above-described embodiments of the invention are merely examples set forth to provide a clear understanding of the invention. Many variations and modifications may be made to the above-described embodiment(s) of the invention without departing substantially from the invention. All such modifications and variations are intended to be included herein within the scope of this disclosure and the invention and protected by the following claims.

I claim:

1. A transmitter comprising:
   a main signal path that receives a baseband digital input signal and generates a main signal in response thereto;
   an intermediate frequency (IF) filter in said main signal path for removing unwanted signal components from said main signal;
   power amplifier having non-linearity;
   a digital predistortion signal module for digitally processing said baseband digital input signal to generate a predistortion signal that models an inverse of said non-linearity of said power amplifier; and
   a combiner located between said IF filter and said power amplifier, for combining said predistortion signal with said main signal to generate a combined signal, and for providing said combined signal to said power amplifier.

2. The transmitter of claim 1, wherein said predistortion signal module digitally processes said baseband digital input signal using a non-linear transform function to generate said predistortion signal.

3. The transmitter of claim 1, further comprising a mobile communication device, wherein said transmitter is located within said mobile communication device.

4. The transmitter of claim 3, wherein:
   said baseband digital input signal comprises an in-phase component and a quadrature component; and
   said digital predistortion signal module digitally processes said baseband digital input signal to generate said predistortion signal as a digital predistortion signal including an in-phase component and a quadrature component.

5. The transmitter of claim 1, wherein said IF filter is an analog filter and said main signal is an analog signal.

6. The transmitter of claim 1, wherein said IF filter is a digital filter and said main signal is a digital signal.

7. The transmitter of claim 1, further comprising a local oscillator for generating a radio frequency carrier signal whose frequency defines a transmission frequency of said transmitter.

8. The transmitter of claim 1, further comprising:
   a local oscillator for generating a digital intermediate-frequency carrier signal; and
   a modulator for modulating said digital intermediate-frequency carrier signal with an in-phase and a quadrature portion of said predistortion signal.

9. The transmitter of claim 1, further comprising:
   a local oscillator for generating an analog intermediate-frequency carrier signal; and
   a modulator for modulating said analog intermediate-frequency carrier signal with an in-phase and a quadrature portion of said predistortion signal.

10. A transmitter incorporating baseband-derived predistortion, the transmitter comprising:
    a main signal path that receives a baseband analog input signal and generates a main signal in response thereto;
    an intermediate frequency (IF) filter in said main signal path for removing unwanted signal components from said main signal;
    a power amplifier having non-linearity;
    a predistortion module for processing said baseband analog input signal to generate a predistortion signal that models an inverse of said non-linearity of said power amplifier; and
    a combiner located between said filter and said power amplifier, for combining said predistortion signal with said main signal to generate a combined signal, and for providing said combined signal to said power amplifier.

11. A method of applying baseband-derived predistortion to a power amplifier having non-linearity, the method comprising:
    digitally deriving from an input signal a predistortion signal that models an inverse of said non-linearity of said power amplifier;
    generating a main signal from said input signal;
    filtering at an intermediate frequency (IF) to remove unwanted signal components from said main signal; and
    combining said predistortion signal with said main signal after said filtering step to generate a combined signal for driving said power amplifier.

12. The method of claim 11, wherein said predistortion signal is derived via use of a non-linear transform function.

13. The method of claim 11, wherein said main signal is an analog signal and said filtering is analog filtering.

14. The method of claim 11, wherein said main signal is a digital signal and said filtering is digital filtering.

15. A transmitter comprising:
    a digital portion configured to receive a baseband digital input signal and to generate an analog main signal and an analog predistortion signal in response thereto;
    an intermediate frequency (IF) filter configured to produce a filtered analog main signal by removing out-of-band signal components from the analog main signal;
    a combiner configured to produce a combined signal by combining the filtered analog main signal and the analog predistortion signal; and
    an amplifier having a non-linear response, the amplifier configured to receive and to amplify the combined signal comprising the predistortion signal that is operative to canceling undesirable signal components from a transmitted RF signal.

16. The transmitter of claim 15, wherein:
    the digital portion comprises a digital-to-analog converter configured to receive the baseband digital input signal and to generate the analog main signal in response thereto; and the IF filter comprises an analog filter configured to receive the analog main signal from the digital portion and to remove out-of-band signal components from the analog main signal.

17. A transmitter comprising:
a digital baseband filter system configured to receive a baseband digital input signal and to generate a filtered digital main signal in response thereto;
a first digital-to-analog converter system configured to receive the filtered digital main signal and to generate a baseband analog main signal in response thereto;
a predistortion signal generator system configured to receive the baseband digital input signal and to generate a baseband digital predistortion signal in response thereto;
a second digital-to-analog converter system configured to receive the digital predistortion signal and to generate a baseband analog predistortion signal in response thereto;
a radio frequency (RF) modulator system configured to receive the baseband analog main signal and the baseband analog predistortion signal to generate an RF main signal and an RF predistortion signal in response thereto;
a combiner configured to combine the RF main signal and the RF predistortion signal to generate an RF transmit signal in response thereto; and
an amplifier having a non-linear response, the amplifier configured to receive and to amplify the RF transmit signal comprising the RF predistortion signal that is operative to canceling undesirable signal components from a transmitted RF signal.

18. The transmitter of claim 17, wherein:
the baseband digital input signal comprises an in-phase digital component and a quadrature digital component;
the first digital-to-analog converter system comprises a first in-phase digital-to-analog converter and a first quadrature digital-to-analog converter;
the second digital-to-analog converter system comprises a second in-phase digital-to-analog converter and a second quadrature digital-to-analog converter;
the baseband analog main signal comprises an in-phase analog signal component and a quadrature analog signal component; and
the baseband analog predistortion signal an in-phase analog predistortion component and a quadrature analog predistortion component.

* * * * *

UNITED STATES PATENT AND TRADEMARK OFFICE
CERTIFICATE OF CORRECTION

PATENT NO. : 7,095,799 B2 Page 1 of 1
APPLICATION NO. : 10/135918
DATED : August 22, 2006
INVENTOR(S) : Braithwaite It is certified that error appears in the above-identified patent and that said Letters Patent is hereby corrected as shown below:

On the face page, in field (56), under "Other Publications", in column 2, line 2, delete "vol." and insert -- Vol. --, therefor.

In column 21, line 36, in Claim 1, before "power" insert -- a --.

Signed and Sealed this

Twenty-ninth Day of April, 2008

JON W. DUDAS
*Director of the United States Patent and Trademark Office*